United States Patent
Kojima

(10) Patent No.: US 8,065,102 B2
(45) Date of Patent: Nov. 22, 2011

(54) PULSE WIDTH MEASUREMENT CIRCUIT

(75) Inventor: Shoji Kojima, Tokyo (JP)

(73) Assignee: Advantest Corporation, Tokyo (JP)

(*) Notice: Subject to any disclaimer, the term of this patent is extended or adjusted under 35 U.S.C. 154(b) by 208 days.

(21) Appl. No.: 12/200,914

(22) Filed: Aug. 28, 2008

(65) Prior Publication Data

US 2010/0052651 A1    Mar. 4, 2010

(51) Int. Cl.
  *G01R 25/00*    (2006.01)
(52) U.S. Cl. .............. 702/79; 702/57; 702/89; 368/113; 368/118; 368/120
(58) Field of Classification Search .................... 702/57, 702/79, 89; 368/113, 118, 120
  See application file for complete search history.

(56) References Cited

U.S. PATENT DOCUMENTS

| | | | | |
|---|---|---|---|---|
| 4,719,608 | A * | 1/1988 | Genat et al. | 368/113 |
| 5,694,377 | A * | 12/1997 | Kushnick | 368/120 |
| 5,969,555 | A * | 10/1999 | Suda | 327/172 |
| 7,196,778 | B2 * | 3/2007 | Lin et al. | 356/5.01 |
| 7,564,284 | B2 * | 7/2009 | Henzler et al. | 327/261 |
| 2003/0038646 | A1 * | 2/2003 | Furukawa | 324/753 |
| 2006/0197567 | A1 * | 9/2006 | Jakobs et al. | 327/158 |
| 2007/0226670 | A1 * | 9/2007 | Yamamoto | 716/6 |
| 2008/0111720 | A1 * | 5/2008 | Huang et al. | 341/53 |
| 2009/0072812 | A1 * | 3/2009 | Henzler et al. | 324/76.82 |
| 2009/0236532 | A1 * | 9/2009 | Frach et al. | 250/363.04 |

* cited by examiner

*Primary Examiner* — Drew A Dunn
*Assistant Examiner* — Hyun Park
(74) *Attorney, Agent, or Firm* — Martine Penilla Group, LLP

(57) ABSTRACT

A pulse width measurement circuit generates a time difference signal that corresponds to the pulse width of the input pulse signal PULSE. A delay circuit delays the input pulse signal PULSE by a predetermined amount, and outputs a start signal. An inverter inverts the input pulse signal PULSE, and outputs a stop signal. A time measurement circuit measures the time difference between a positive edge in the start signal and a positive edge in the stop signal, and outputs a time difference signal that corresponds to the time difference.

14 Claims, 8 Drawing Sheets

PULSE WIDTH MEASUREMENT CIRCUIT

BACKGROUND OF THE INVENTION

1. Field of the Invention

The present invention relates to a technique for measuring the pulse width of a pulse signal.

2. Description of the Related Art

In electronic circuits, a pulse signal which alternately switches between a high-level state and a low-level state is employed for the purpose of transmitting various information. In order to measure the pulse width of the pulse signal, various kinds of pulse width measurement circuits are employed.

In general, there is a tradeoff between the measurement resolution of the pulse width and the measurement range thereof. That is to say, raised resolution leads to a reduced measurement range. On the other hand, increased measurement range leads to lowered resolution. An arrangement which provides both high resolution and wide measurement range requires an increased circuit area for measuring the pulse width.

SUMMARY OF THE INVENTION

The present invention has been made in view of such a situation. Accordingly, it is a general purpose of the present invention to provide a pulse width measurement circuit which offers both the high resolution and wide measurement range.

An embodiment of the present invention relates to a pulse width measurement circuit which generates a signal that corresponds to the pulse width of an input pulse signal.

The pulse width measurement circuit comprises: a delay circuit which delays the input pulse signal, and outputs a start signal; an inverter which inverts the input pulse signal, and outputs a stop signal; and a time measurement circuit which receives the start signal and the stop signal, and outputs a signal that corresponds to the time difference between an edge in the start signal and an edge in the stop signal.

The pulse width measurement circuit measures the high-level period as the pulse width of the input pulse signal. With the high-level period as TH, and with the delay amount provided by the delay circuit as τd, the time measurement circuit measures the time difference τ (=T−τd) between an edge in the start signal and an edge in the stop signal. Thus, such an arrangement virtually increases the measurement range by the delay amount τd.

Another embodiment of the present invention also relates to a pulse width measurement circuit. The pulse width measurement circuit comprises: an inverter which inverts the input pulse signal; a delay circuit which delays the input pulse signal thus inverted, and outputs a start signal; and a time measurement circuit which receives the start signal and a stop signal which is the input pulse signal, and outputs a signal that corresponds to the time difference between an edge in the start signal and an edge in the stop signal.

With such an embodiment, the low-level period of the input pulse signal is measured as the pulse width thereof. Such an arrangement increases the measurement range by the delay amount τd.

Also, the delay circuit may be a variable delay circuit which is capable of adjusting the delay amount. With such an arrangement, the delay amount can be adjusted according to the assumed pulse width, thereby setting the optimum measurement range.

Also, the delay amount provided by the delay circuit may be set to a value smaller than an assumed minimum value of the pulse width of the input pulse signal.

Also, the time measurement circuit may be a time to digital converter including: a first multi-stage delay circuit having N (N represents an integer) first delay elements connected in a cascade manner, and which applies a predetermined first delay amount to the start signal at each stage; and N latch circuits which are provided to the N first delay elements correspondingly, and each of which latches the value of either the start signal or the stop signal to be input to the corresponding first delay element at a timing of an edge in the other signal.

Also, the time measurement circuit may further include a second multi-stage delay circuit which has N second delay elements connected in a cascade manner, and which applies a predetermined second delay amount to the stop signal at each stage. Also, each of the N latch circuits may latch the value of either the start signal to be input to the corresponding first delay element or the stop signal to be input to the corresponding second delay element at a timing of an edge in the other signal.

Yet another embodiment of the present invention also relates to a pulse width measurement circuit which generates a signal that corresponds to the pulse width of an input pulse signal. The pulse width measurement circuit comprises: a first inverter which inverts the input pulse signal, and outputs a stop signal; a first multi-stage delay circuit having N (where N is an integer) first delay elements connected in a cascade manner, and which applies a predetermined first delay amount to the start signal at each stage; a second multi-stage delay circuit having N second delay elements connected in a cascade manner, and which applies a predetermined second delay amount to the stop signal at each stage; N latch circuits which are provided to the N pairs of the first delay element and the second delay element correspondingly, and each of which latches the value of either the start signal to be input to the corresponding first delay element or the stop signal to be input to the corresponding second delay element at a timing of an edge in the other signal; and a second inverter which inverts one of the output signals of the N second delay elements, and outputs the start signal.

With such an embodiment, the stop signal delayed by the second delay element is inverted, and the inverted signal is used as the start signal. Thus, such an embodiment does not require a delay circuit which applies the delay amount τd used to increase the measurement range, thereby realizing a reduced circuit area.

Also, the pulse width measurement circuit according to such an embodiment may further include a selector which receives the output signals of the N second delay elements, selects one of these output signals, and outputs the output signal thus selected. Also, the second inverter may invert the output signal of the selector, and may output the start signal.

With such an arrangement, by controlling the selector, the delay amount τd can be set as desired so as to increase the measurement range.

Yet another embodiment of the present invention also relates to a pulse width measurement circuit. The pulse width measurement circuit comprises: a first multi-stage delay circuit having N (N represents an integer) first delay elements connected in a cascade manner, and which applies a predetermined first delay amount to the start signal at each stage; a second multi-stage delay circuit having N second delay elements connected in a cascade manner, and which applies a predetermined second delay amount to the stop signal, which is the input pulse signal, at each stage; N latch circuits which are provided to the N pairs of the first delay element and the second delay element correspondingly, and each of which latches the value of either the start signal to be input to the corresponding first delay element or the stop signal to be input to the corresponding second delay element at a timing of an edge in the other signal; and an inverter which inverts one of the output signals of the N second delay elements, and outputs the start signal.

Such an embodiment does not require a delay circuit, thereby realizing a reduced circuit area.

Also, the pulse width measurement circuit may further include a selector which receives the output signals of the N second delay elements, selects one of these output signals, and outputs the output signal thus selected. Also, the inverter may invert the output signal of the selector, and may output the start signal.

Yet another embodiment of the present invention also relates to a pulse width measurement circuit. The pulse width measurement circuit includes: a first pulse width measurement circuit which measures the high-level period of an input pulse signal according to any one of the above-described embodiments; a second pulse width measurement circuit which measures the low-level period of the input pulse signal according to any one of the above-described embodiments; and a selector which receives the signals output from the first pulse width measurement circuit and the second pulse width measurement circuit, and selects one from these signals thus received.

Such an embodiment is capable of measuring both the high-level period and the low-level period of the input pulse signal.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B. In the same way, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 1:
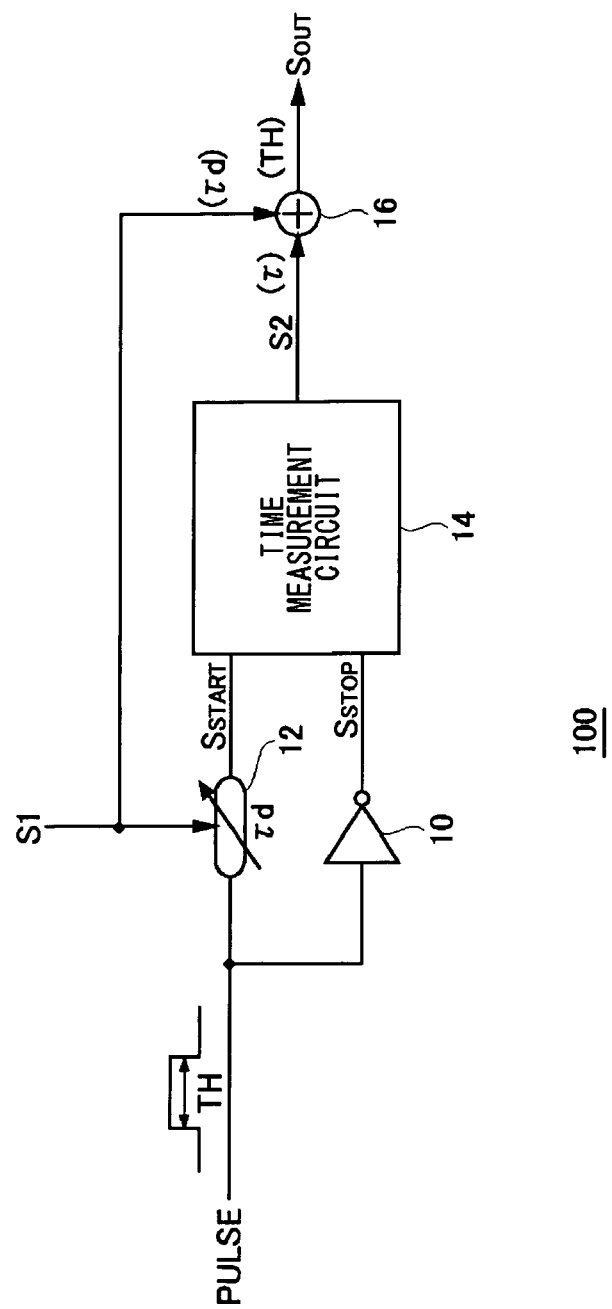
FIG. 1 is a block diagram which shows the configuration of a pulse width measurement circuit according to an embodiment.

FIG. 1 is a block diagram which shows a configuration of a pulse width measurement circuit 100 shown in FIG. 1 according to an embodiment. The pulse width measurement circuit 100 measures the pulse width (high-level period TH) of an input pulse PULSE, and outputs an output signal $S_{OUT}$ according to the pulse width thus measured.

The pulse width measurement circuit 100 includes an inverter 10, a delay circuit 12, a time measurement circuit 14, and a computation unit 16. The delay circuit 12 applies a predetermined delay amount τd to the input pulse signal PULSE, and outputs a start signal $S_{START}$. The delay circuit 12 is preferably a variable delay circuit. The delay amount τd is set for the delay circuit 12 according to a delay control signal S1. The delay amount τd is selected in a range such that it does not exceed the assumed minimum value of the pulse width of the input pulse signal PULSE to be measured.

The inverter 10 inverts the input pulse signal PULSE, and outputs an stop signal $S_{STOP}$.

The time measurement circuit 14 receives the start signal $S_{START}$ and the stop signal $S_{STOP}$. The time measurement circuit 14 outputs a signal (which will be referred to as a "time difference signal" hereafter) S2 according to the time difference τ between a positive edge in the start signal $S_{START}$ and a positive edge in the stop pulse signal $S_{STOP}$. For example, a TDC (TDC: Time to Digital Converter) disclosed in U.S. Pat. No. 4,719,608 or a similar TDC can be suitably employed in the time measurement circuit 14. However, the present invention is not restricted to such an arrangement. Also, the time measurement circuit 14 may be a TAC (TAC: Time to Analog Converter) which measures the time difference between the edges using analog signal processing. In the TAC, the technique disclosed in U.S. Pat. No. 4,408,166 can be employed, for example.

That is to say, the time measurement circuit 14 may output the time difference signal S2 in the form of either a digital value or an analog value.

The computation unit 16 performs computation processing on the time difference signal S2 which indicates the time difference τ and the delay control signal S1 which indicates the delay amount τd, and outputs an output signal $S_{OUT}$ which indicates the sum of the time difference τ and the delay amount τd. The computation unit 16 may provides the computation processing in the form of either analog signal processing or digital signal processing. It should be noted that, in a case in which the delay amount τd is a known fixed value, the processing provided by the computation unit 16 is not necessarily needed. With such an arrangement, the time difference signal S2 may be output as the output signal $S_{OUT}$.

Figure 2:
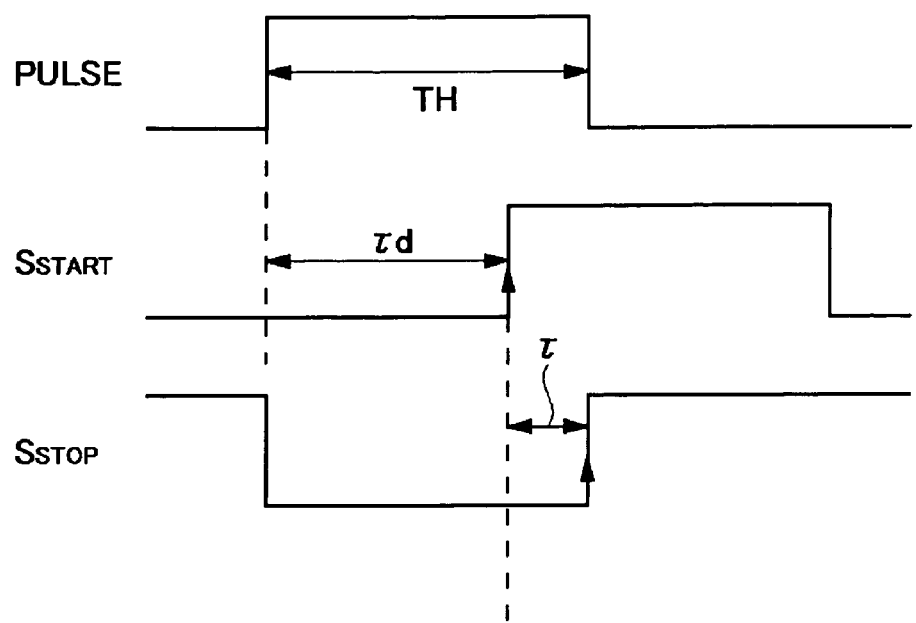
FIG. 2 is a time chart which shows the operation of the pulse width measurement circuit shown in FIG. 1.

The above is the overall configuration of the pulse width measurement circuit 100. Next, description will be made regarding the operation thereof. FIG. 2 is a time chart which shows the operation of the pulse width measurement circuit 100 shown in FIG. 1. As can be clearly understood from FIG. 2, the pulse width (high-level period) TH, which is to be measured by the pulse width measurement circuit 100, is represented by the following Expression using the time difference τ between a positive edge in the start signal $S_{START}$ and an positive edge in the stop signal $S_{STOP}$ and the delay period τd.

$$TH=\tau d+\tau$$

As described above, the pulse width measurement circuit 100 shown in FIG. 1 is capable of measuring the pulse width of the input pulse signal PULSE.

The pulse width measurement circuit 100 provides both the wide measurement range and the high resolution for the pulse width. This advantage can be clearly understood by making a comparison with a circuit which has no delay circuit 12.

Description will be made assuming that the time measurement circuit 14 is capable of measuring the time difference τ between the positive edge in the start signal $S_{START}$ and the positive edge in the stop signal $S_{STOP}$ with a resolution of Δt and with a maximum gradation level of m (m represents an integer). In this case, the upper limit of the measurement range of the time measurement circuit 14 is represented by the Expression; m×Δt.

In a case in which the pulse width measurement circuit 100 does not include the delay circuit 12, the upper limit of the pulse width THmax' which can be measured by the pulse width measurement circuit 100 is represented by the following Expression.

$$TH\text{max}'=m\times\Delta t$$

For example, in a case in which Δt=1 ps, and m=20, the maximum pulse width which can be measured is 20 ps. In order to increase the maximum pulse width which can be measured to 100 ps while maintaining the resolution, such an arrangement requires the maximum gradation level of m=100. This leads to an increase in the circuit area. Alternatively, in order to increase the maximum pulse width which can be measured to 100⁻ ps while maintaining a maximum gradation level of m, there is a need to lower the resolution Δt to 5 ps.

On the other hand, the upper limit THmax of the pulse width TH of the input pulse signal PULSE width which can be measured by the pulse width measurement circuit 100 shown in FIG. 1 is represented by the following Expression.

$$TH\text{max}=\tau d+m\times\Delta t$$

In a case in which τd is set to 80 ps, the maximum pulse width which can be measured is increased to 100 ps while maintaining the same resolution Δt(=1 ps) and the same maximum gradation level m(=20), as compared with an arrangement which does not include the delay circuit 12. Also, in a case in which the same pulse width THmax' is provided while maintaining the same maximum gradation level m(=20) as with an arrangement which does not include the delay circuit 12, by setting the delay amount τd to 10 ps, such an arrangement raises the resolution Δt to 0.5 ps. Also, by setting τd to 10 ps while maintaining the resolution Δt(=1 ps), the maximum gradation level m can be reduced to 10, thereby reducing the circuit scale.

As described above, the pulse width measurement circuit 100 shown in FIG. 1 provides high-resolution and high-range measurement without involving a tradeoff between the resolution Δt and the maximum gradation level m.

Seen from a different perspective, the pulse width measurement circuit 100 shown in FIG. 1 has the advantage of allowing the measurement range to be set as desired by changing the delay amount τd.

Figure 3:
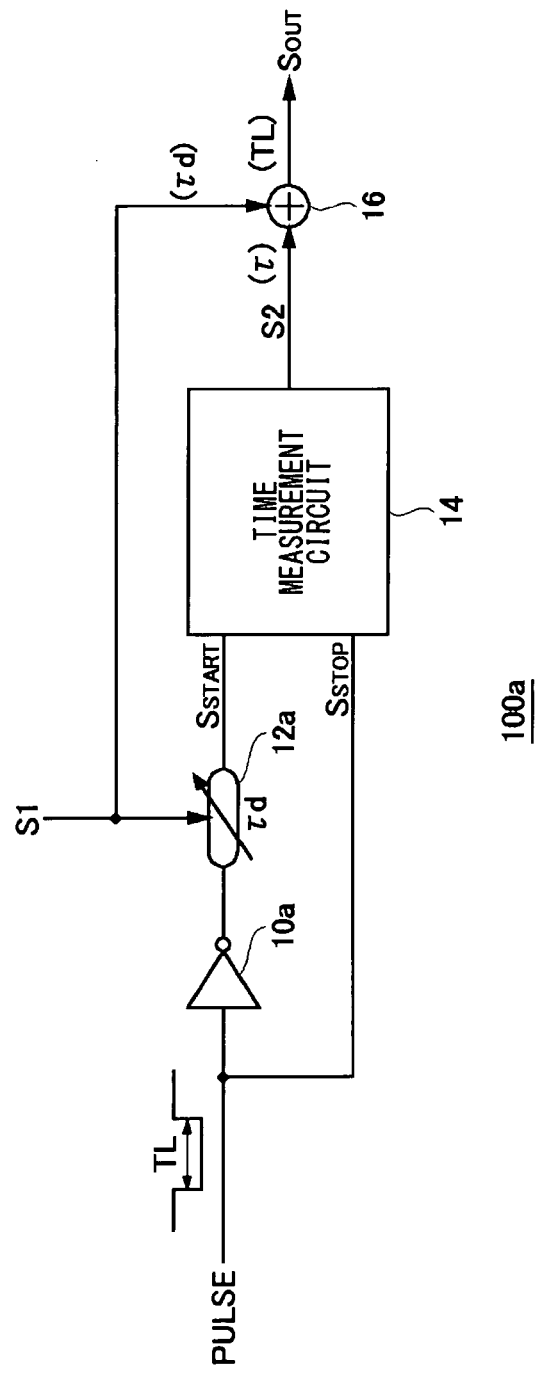
FIG. 3 is a block diagram which shows the configuration of a pulse width measurement circuit according to a modification.

FIG. 3 is a block diagram which shows a pulse width measurement circuit 100a according to a modification of the embodiment. The pulse width measurement circuit 100a measures the low-level period TL of the input pulse signal PULSE as the pulse width. The pulse width measurement circuit 100a includes an inverter 10a, a delay circuit 12a, a time measurement circuit 14, and a computation unit 16. The inverter 10a inverts the input pulse signal PULSE. The delay circuit 12a applies a predetermined delay amount τd to the inverted input pulse signal #PULSE so as to output a start signal $S_{START}$. The positions of the inverter 10a and the delay circuit 12a may be switched. The other configuration and operation are the same as those shown in FIG. 1.

The pulse width measurement circuit 100a shown in FIG. 3 provides at least one of high resolution and wide measurement range, in the same way as with the pulse width measurement circuit 100 shown in FIG. 1.

Figure 4:
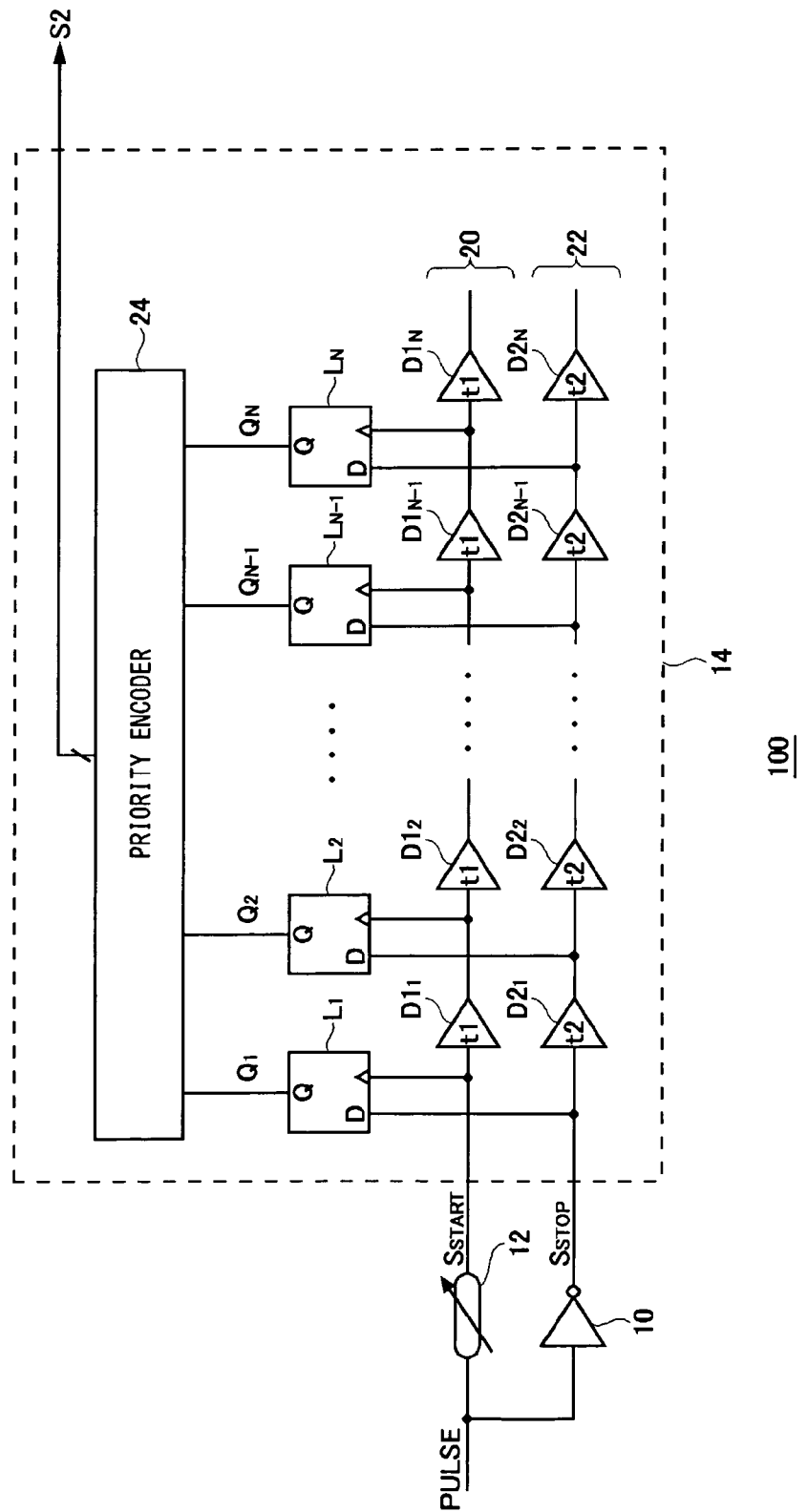
FIG. 4 is a detailed circuit diagram of the pulse width measurement circuit shown in FIG. 1.

FIG. 4 is a detailed circuit diagram of the pulse width measurement circuit 100 shown in FIG. 1. In FIG. 4, the computation unit 16 is not shown.

The time measurement circuit 14 includes a first multi-stage delay circuit 20, a second multi-stage delay circuit 22, multiple latch circuits $L_1$ through $L_N$, and a priority encoder 24.

The first multi-stage delay circuit 20 includes N (N represents an integer) first delay elements $D1_1$ through $D1_N$ connected in a cascade manner, and applies a first predetermined delay t1 to the start signal $S_{START}$ for every stage. The second multi-stage delay circuit 22 includes N second delay elements $D2_1$ through $D2_N$ connected in a cascade manner, and applies a second predetermined delay t2 to the stop signal $S_{STOP}$ for every stage.

The relation between the delay amount t1 and the delay amount t2 satisfies the following Expression.

$$t1=\Delta t+t2$$

Here, Δt represents the resolution of the time measurement circuit 14.

The N latch circuits $L_1$ through $L_N$ are provided in increments of N pairs of the first delay element D1 and the second delay element D2. The i'th latch circuit $L_i$ latches either the start signal $S_{START}$ input to the corresponding first delay element $D1_i$, or the stop signal $S_{STOP}$ input to the corresponding second delay element $D2_i$, at the timing of the positive edge included in the other signal. In FIG. 4, the stop signal $S_{STOP}$ is input to the data terminal of the latch circuit $L_i$, and the start signal $S_{START}$ is input to the clock terminal thereof.

The priority encoder 24 receives the output signals $Q_1$ through $Q_N$ from the N latch circuits $L_1$ through $L_N$. The output signals $Q_1$ through $Q_N$ are a so-called thermometer code. The priority encoder 24 converts the thermometer code into a binary code, thereby generating an output signal S2. It should be noted that, in a case in which such an arrangement includes a downstream circuit which is capable of processing the thermometer code, the priority encoder 24 can be eliminated.

The time difference between the start signal $S_{START}$ and the stop signal $S_{STOP}$ is reduced by Δt=(t1−t2) every time the start signal $S_{START}$ and the stop signal $S_{STOP}$ pass through a single stage of the delay elements D1 and D2 included in the first multi-stage delay circuit 20 and the second multi-stage delay circuit 22. In a case in which the initial time difference between the start signal $S_{START}$ and the stop signal $S_{STOP}$ is τ, the relation of the timing between the edges in the two signals is inverted when the two signals pass through the (τ/Δt)'th stage delay elements.

Let us consider a case in which the stop signal $S_{STOP}$ has caught up with the start signal $S_{START}$ at the j'th (j is smaller than or equal to N) stage delay elements. In this case, the output signals $Q_1$ through $Q_j$ are set to 0. Furthermore, the output signals $Q_{j+1}$ through $Q_N$, which are output from the other delay elements downstream of the j'th stage delay elements at which the stop signal $S_{STOP}$ has caught up with the start signal $S_{START}$, are set to 1. The term "thermometer code" comes from the fact that, at a boundary point defined by a given bit, the data bits change from 1 to 0 (or 0 to 1), like a thermometer.

It should be noted that, in a case in which the stop signal $S_{STOP}$ has not caught up with the start signal $S_{START}$, all the bits of the thermometer code $Q_1$ through $Q_N$ are set to 0. On the other hand, in a case in which the stop signal $S_{STOP}$ has been input before the start signal $S_{START}$, all the bits are set to 1. These states can occur when the delay amount τd provided by the delay circuit 12 exceeds the pulse width TH of the input pulse signal PULSE.

Such an arrangement employing the time measurement circuit 14 shown in FIG. 4 provides extremely high resolution Δt. Furthermore, the time difference τ between the start signal $S_{START}$ and the stop signal $S_{STOP}$ is measured, and the time difference τ thus measured can be converted into a digital value.

It should be noted that an arrangement may be made in which the delay amount t2 is set to 0, and all the second delay elements D2 are eliminated, thereby realizing a reduced circuit area. With such an arrangement, the i'th latch $L_i$ latches the value of either the start signal $S_{START}$ or the stop signal $S_{STOP}$ input to the corresponding first delay element $D1_i$ at the timing of the edge in the other signal. With such an arrangement, the resolution Δt of the time measurement circuit 14 matches the delay amount t1 of the first delay element D1.

Figure 5:
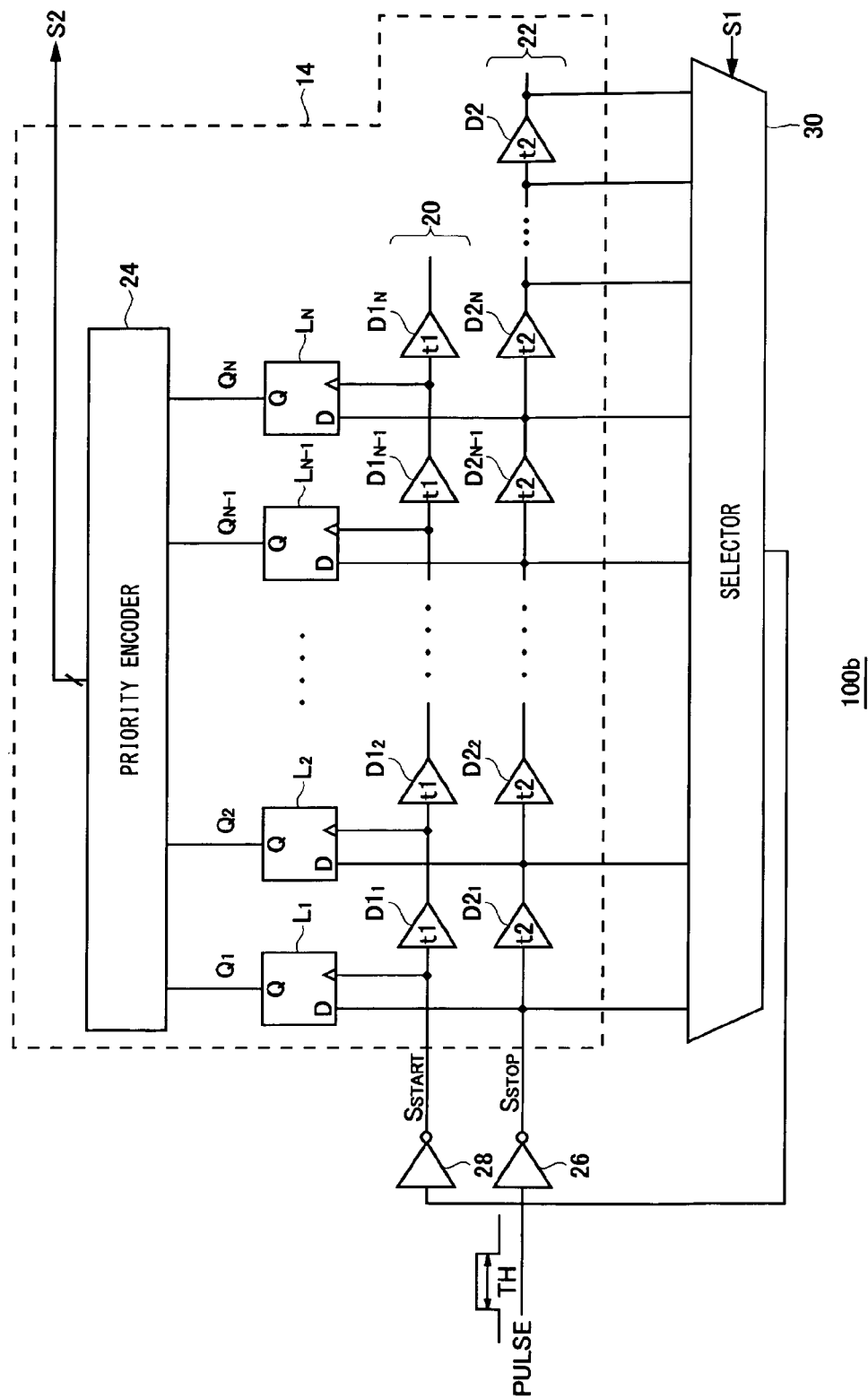
FIG. 5 is a circuit diagram which shows a modification of the pulse width measurement circuit shown in FIG. 4.

FIG. 5 is a circuit diagram which shows a modification of the pulse width measurement circuit shown in FIG. 4. The pulse width measurement circuit 100b shown in FIG. 5 includes a first inverter 26, a second inverter 28, a selector 30, and a time measurement circuit 14.

The first inverter 26 inverts the input pulse signal PULSE so as to output a stop signal $S_{STOP}$.

The selector 30 receives output signals or input signal of at least N second delay elements, i.e., delayed stop signals $S_{STOP}$, selects one from these signals thus received according to a delay control signal S1, and outputs the signal thus selected. Furthermore, the selector 30 may further receive the input signals or output signals of additional second delay elements D2 downstream from the N'th-stage second delay element $D2_N$.

The second inverter 28 inverts the output signal of the selector 30 so as to output a start signal $S_{START}$.

In the pulse width measurement circuit 100b shown in FIG. 5, when the selector 30 selects the output signal of the k'th-stage second delay element $D2_k$, the start signal $S_{START}$ is a signal obtained by delaying the input pulse signal PULSE by τd=k×t2+Ti1+Ti2.

Here, Ti1 and Ti2 represent the delay amount provided by the first inverter 26 and the delay amount provided by the second inverter 28, respectively.

That is to say, in the pulse width measurement circuit 100b shown in FIG. 5, the first inverter 26, the second inverter 28, and the first-stage through k'th-stage second delay elements $D2_1$ through $D2_k$ correspond to the delay circuit 12 shown in FIG. 1.

With the pulse width measurement circuit 100b shown in FIG. 5, the delay circuit 12 can be eliminated, as compared with the pulse width measurement circuit 100 shown in FIG. 4. Thus, such an arrangement provides a reduced circuit area. Furthermore, by switching the selected node using the selector 30, the delay amount τd can be adjusted.

In the pulse width measurement circuit 100b shown in FIG. 5, in a case in which there is no need to change the delay amount τd, the selector 30 may be eliminated. With such an arrangement, the output signal of the k'th-stage second delay element $D2_k$ may be directly input to the second inverter 28.

It is needless to say that the same modifications shown in FIG. 4 and FIG. 5 can be applied to the pulse width measurement circuit 100a which measures the low-level period shown in FIG. 3, which is encompassed in the scope of the present invention.

Figure 6:
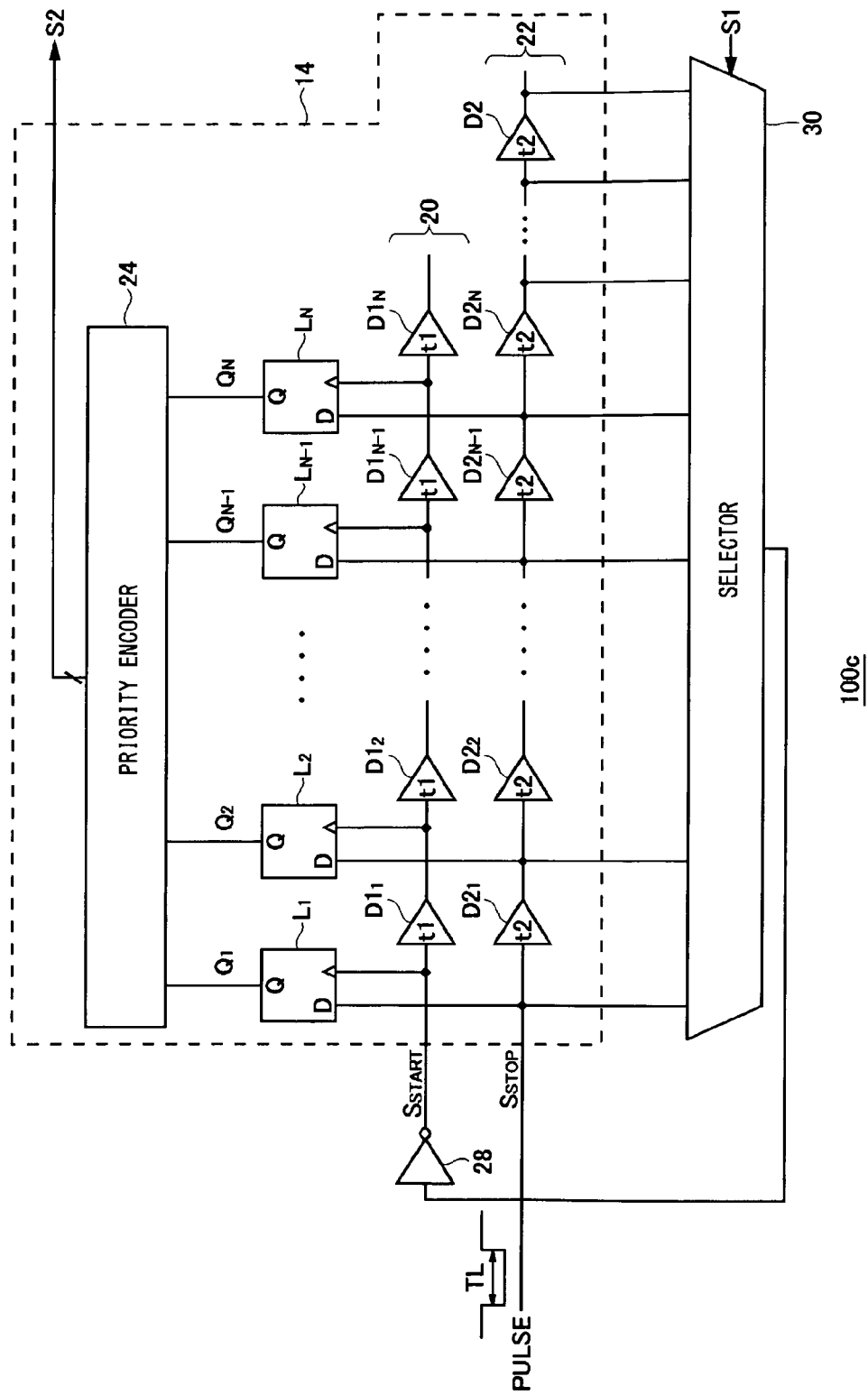
FIG. 6 is a circuit diagram which shows a modification of the pulse width measurement circuit shown in FIG. 3.

FIG. 6 is a circuit diagram which shows a modification of the pulse width measurement circuit shown in FIG. 3. The pulse width measurement circuit 100c shown in FIG. 6 includes an inverter 28, a selector 30, and a time measurement circuit 14.

The input pulse signal PULSE is input to the time measurement circuit 14 as the stop signal. The selector 30 receives at least N output signals or input signals of the second delay elements, i.e., delayed stop signals $S_{STOP}$, selects one of these stop signals $S_{STOP}$ according to the delay control signal S1, and outputs the signal thus selected. Also, the selector 30 may further receive the input signals or output signals of the second delay elements D2 which are downstream of the N'th stage second delay element $D2_N$.

The inverter 28 inverts the output signal of the selector 30, and outputs the start signal $S_{START}$.

In a case in which, in the pulse width measurement circuit 100c shown in FIG. 6, the selector 30 selects the output signal of the k'th stage second delay element $D2_k$, the start signal $S_{START}$ is a signal obtained by delaying the input pulse signal PULSE by τd=k×t2+Ti2. Here, Ti2 represents the delay amount provided by the inverter 28.

That is to say, in the pulse width measurement circuit 100c shown in FIG. 6, the inverter 28 corresponds to the inverter 10a shown in FIG. 3, and the first stage through the k'th stage second delay elements $D2_1$ through $D2_k$ correspond to the delay circuit 12a shown in FIG. 3.

With the pulse width measurement circuit 100c shown in FIG. 6, the delay circuit 12a can be eliminated, as compared with the pulse width measurement circuit 100 shown in FIG. 3, thereby providing a reduced circuit area. Furthermore, by switching the selected node using the selector 30, the delay amount τd can be adjusted.

Figure 7:
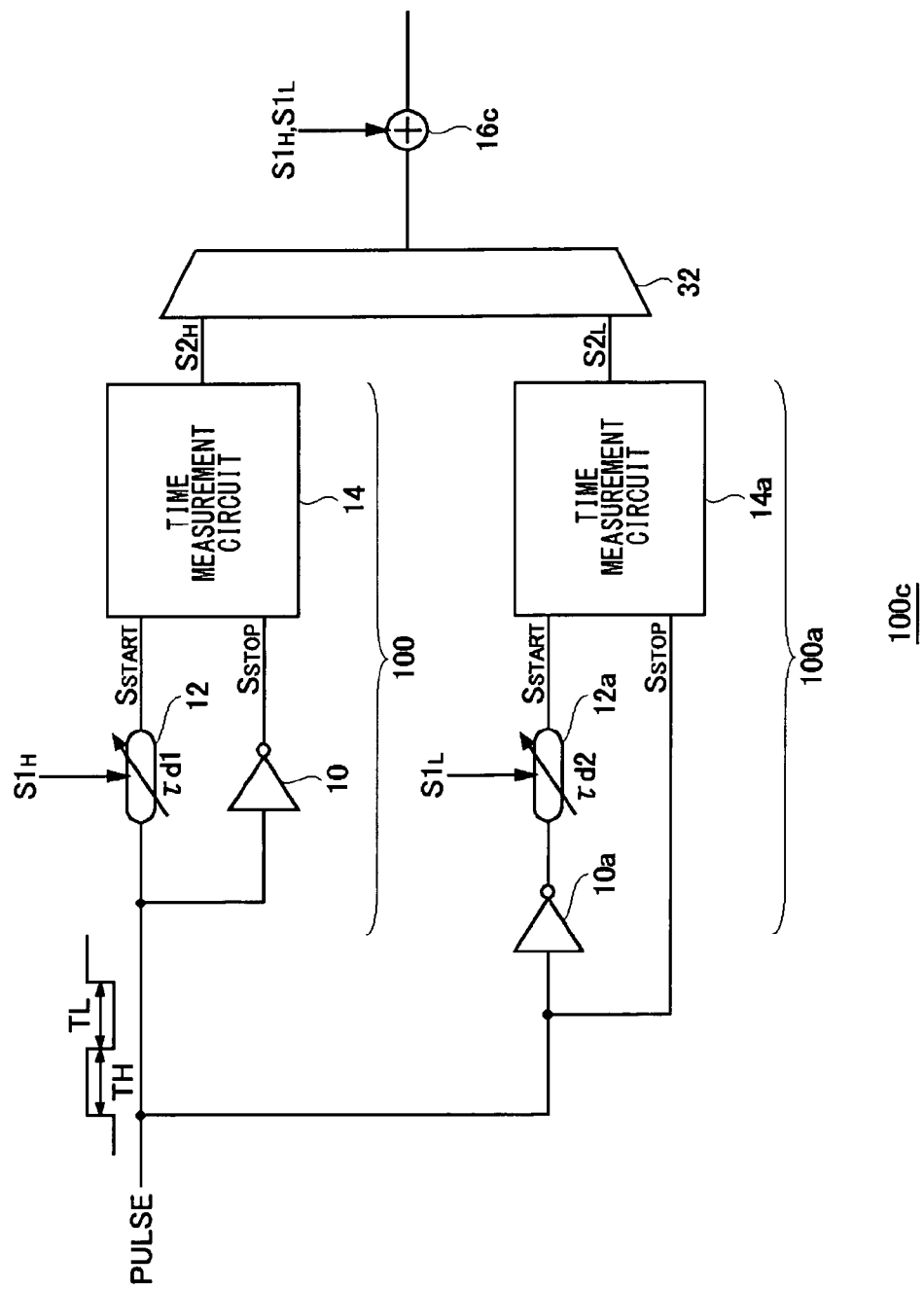
FIG. 7 is a block diagram which shows the configuration of a pulse width measurement circuit according to another modification.

FIG. 7 is a block diagram which shows a configuration of a pulse width measurement circuit 100c according to another modification. The pulse width measurement circuit 100c shown in FIG. 7 includes a first pulse width measurement circuit 100 and a second pulse width measurement circuit 100a. The pulse width measurement circuit 100 measures the high-level period TH of the input pulse signal PULSE in the same way as with the pulse width measurement circuit 100 shown in FIG. 1. The delay amount τd1 provided by the delay circuit 12 of the pulse width measurement circuit 100 is set according to a delay control signal $S1_H$. The output signal $S2_H$ of the time measurement circuit 14 indicates the time difference $\tau_H$(=TH−τd1) between an edge in the start signal $S_{START}$ and an edge in the stop signal $S_{STOP}$.

The pulse width measurement circuit 100a measures the low-level period TL of the input pulse signal PULSE in the same way as with the pulse width measurement circuit 100a shown in FIG. 3. The delay amount τd2 provided by the delay circuit 12a of the pulse width measurement circuit 100a is set according to a delay control signal $S1_L$. The output signal $S2_L$ of the time measurement circuit 14a indicates the time difference $τ_L$(=TL−τd2) between an edge in the start signal $S_{START}$ and an edge in the stop signal $S_{STOP}$.

The selector 32 selects either the time difference signal $S2_H$ or the time difference signal $S2_L$. The computation unit 16c adds the delay amount τd1 to the time difference $τ_H$, and adds the delay amount τd2 to the time difference $τ_L$, in the same way as with the computation unit 16 shown in FIG. 1 and FIG. 3. It can be understood that, in a case of τd1=τd2, such an arrangement would provide a more simple circuit configuration.

With the pulse width measurement circuit 100c shown in FIG. 7, both the high-level period TH and the low-level period TL of the input pulse signal PULSE can be measured. The selector 32 may alternately select the time difference signals $S2_H$ and $S2_L$ according to the level transition of the input pulse signal PULSE in a time sharing manner. Furthermore, by calculating the sum of the high-level state TH and the low-level state, the cycle period of the input pulse signal PULSE can be measured.

Description has been made with reference to FIG. 7 regarding an arrangement in which the computation unit 16c is located downstream to the selector 32 so as to provide a reduced circuit area. Also, the computation unit 16c may be provided to each of the output side of the pulse width measurement circuit 100 and the output side of the pulse width measurement circuit 100a.

Furthermore, the delay circuit 12 and the delay circuit 12a may be eliminated from the configuration shown in FIG. 7, which is encompassed by the scope of the present invention.

Figure 8:
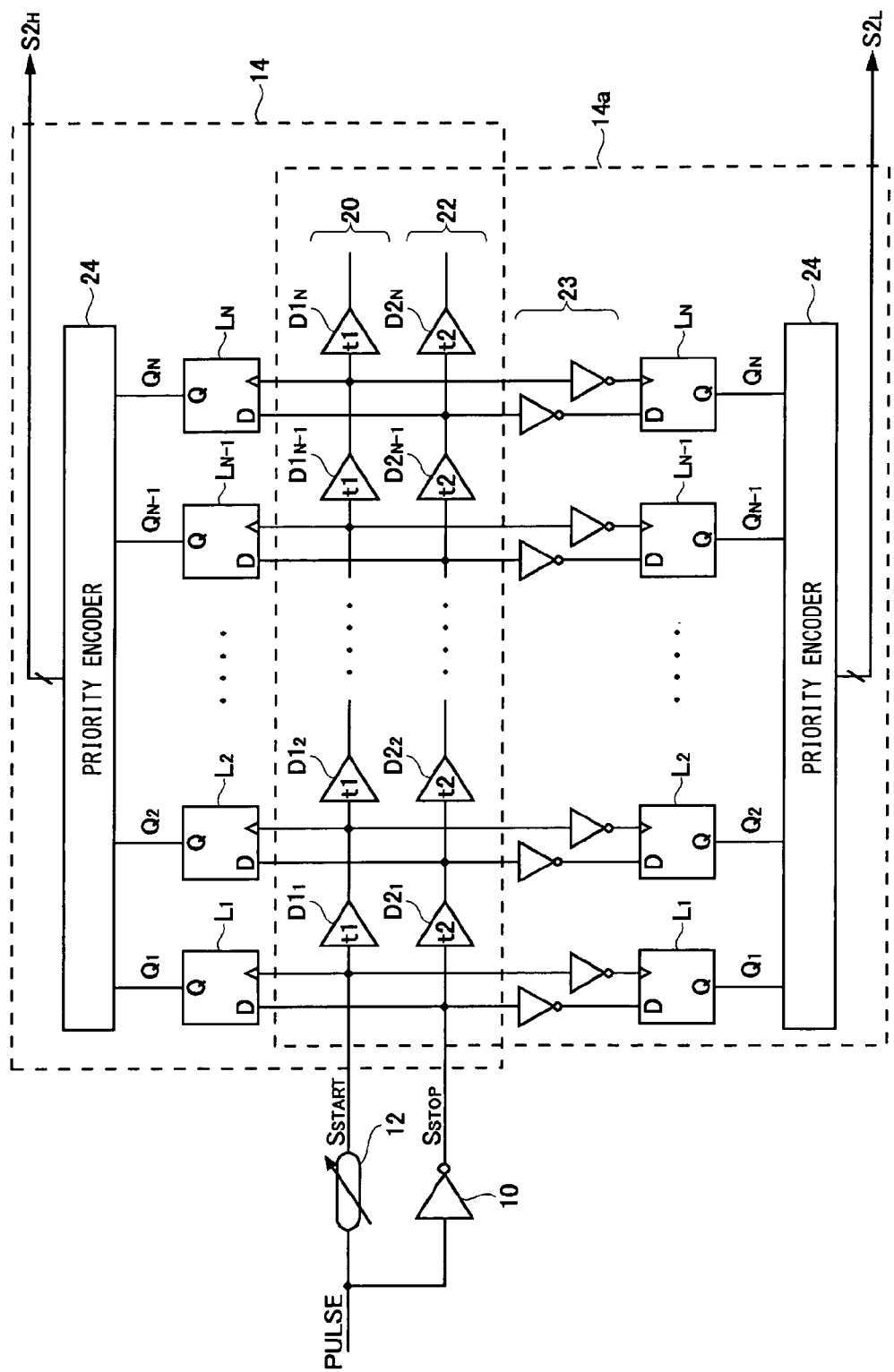
FIG. 8 is a circuit diagram which shows the configuration of a modification of the pulse width measurement circuit shown in FIG. 7.

FIG. 8 is a circuit diagram which shows a configuration of a modification of the pulse width measurement circuit shown in FIG. 7. A pulse width measurement circuit 100d shown in FIG. 8 measures both the high-level period TH and the low-level period TL of the input pulse signal PULSE in the same way as with that shown in FIG. 7.

In the pulse width measurement circuit 100d shown in FIG. 8, the inverters 10 and 10a and the delay circuits 12 and 12a provided in the input stage are shared. Furthermore, each of the first time measurement circuit 14 and the second time measurement circuit 14a is configured as the TDC shown in FIG. 4. With such configurations, the first multi-stage delay circuit 20 and the second multi-stage delay circuit 22 are shared. The configuration of the first time measurement circuit 14 side is the same as that shown in FIG. 4.

The second time measurement circuit 14a side includes an inverter circuit 23. The inverter circuit 23 includes (2×N) inverters each of which is provided to one of the N first delay elements D1 and the N second delay elements D2. Each inverter performs logical inversion on the input signal, and outputs the signal thus inverted to the corresponding latch circuit L. The i'th latch circuit $L_i$ on the second time measurement circuit 14a side receives the inverted signal of the start signal $S_{START}$, which is to be input to the corresponding first delay element $D1_i$, via the clock terminal, and receives the inverted signal of the stop signal $S_{STOP}$, which is to be input to the corresponding second delay element $D2_i$, via the data terminal.

With such a configuration shown in FIG. 8, the inverter 10, the delay circuit 12, the first multi-stage delay circuit 20, and the second multi-stage delay circuit 22 are shared, thereby providing a reduced circuit area. Furthermore, such an arrangement provides the advantage of allowing the first delay elements D1 and the second delay elements D2 to be calibrated in only half steps. It is needless to say that an arrangement in which the second multi-stage delay circuit 22 is eliminated from the configuration shown in FIG. 8 may be effectively realized. Furthermore, the modifications shown in FIG. 5 and FIG. 6 may be applied to the configuration shown in FIG. 8.

In a case in which a differential transmission path is employed, by switching the positive wiring and the negative wiring of the differential pair (which is referred to as "differential inversion"), such an arrangement provides the same function as that of an inverter (logical inverter). Thus, such an arrangement does not require an inverter component in the form of a circuit device element, thereby realizing a further reduced circuit area. For example, with the configurations shown in FIG. 5 and FIG. 6, the inverter 26 and the inverter 28 may be eliminated using the differential inversion. With such an arrangement, each of the delay amounts Ti1 and Ti2 is substantially zero.

While the preferred embodiments of the present invention have been described using specific terms, such description is for illustrative purposes only, and it is to be understood that changes and variations may be made without departing from the spirit or scope of the appended claims.

What is claimed is:

1. A pulse width measurement circuit which generates a signal that corresponds to the pulse width of an input pulse signal, comprising:
    an inverter which inverts the input pulse signal, and outputs a stop signal;
    a delay circuit which delays the input pulse signal relative to the stop signal by a time τd, and outputs a start signal;
    a time measurement circuit which receives the start signal and the stop signal, and outputs a signal that corresponds to the time difference between an edge in the start signal and an edge in the stop signal, wherein the time difference is smaller than the pulse width of the input pulse signal by the time τd,
    the delay τd provided by the delay circuit is set to a value smaller than an assumed minimum value of the pulse width of the input pulse signal.

2. A pulse width measurement circuit according to claim 1, wherein the delay circuit is a variable delay circuit which is capable of adjusting the delay amount.

3. A pulse width measurement circuit which generates a signal that corresponds to the pulse width of an input pulse signal, comprising:
    an inverter which inverts the input pulse signal;
    a delay circuit which delays the input pulse signal thus inverted relative to the input pulse signal before the inversion by a time τd, and outputs a start signal; and
    a time measurement circuit which receives the start signal and a stop signal which is the input pulse signal before the inversion, and outputs a signal that corresponds to the time difference between an edge in the start signal and an edge in the stop signal, wherein the time difference is smaller than the pulse width of the input pulse signal by the time τd,
    the delay τd provided by the delay circuit is set to a value smaller than an assumed minimum value of the pulse width of the input pulse signal.

4. A pulse width measurement circuit according to claim 3, wherein the delay circuit is a variable delay circuit which is capable of adjusting the delay amount.

5. A pulse width measurement circuit according to claim 3, wherein the time measurement circuit is a time to digital converter including:
 a first multi-stage delay circuit having N (N represents an integer) first delay elements connected in a cascade manner, and which applies a predetermined first delay amount to the start signal at each stage; and
 N latch circuits, which are provided to the N first delay elements correspondingly, and each of which latches the value of either the start signal or the stop signal to be input to the corresponding first delay element at a timing of an edge in the other signal.

6. A pulse width measurement circuit according to claim 5, wherein the time measurement circuit further includes a second multi-stage delay circuit which has N second delay elements connected in a cascade manner, and which applies a predetermined second delay amount to the stop signal at each stage,
 wherein each of the N latch circuits latches the value of either the start signal to be input to the corresponding first delay element or the stop signal to be input to the corresponding second delay element at a timing of an edge in the other signal.

7. A pulse width measurement circuit which generates a signal that corresponds to the pulse width of an input pulse signal, comprising:
 an inverter which inverts the input pulse signal, and outputs a stop signal;
 a delay circuit which delays the input pulse signal relative to the stop signal, and outputs a start signal;
 a time measurement circuit which receives the start signal and the stop signal, and out puts a signal that corresponds to the time difference between an edge in the start signal and an edge in the stop signal, wherein the time measurement circuit is a time to digital converter including,
  a first multi-stage delay circuit having N (N represents an integer) first delay elements connected in a cascade manner, and which applies a predetermined first delay amount to the start signal at each stage; and
  N latch circuits which are provided to the N first delay elements correspondingly, and each of which latches the value of either the start signal or the stop signal to be input to the corresponding first delay element at a timing of an edge in the other signal.

8. A pulse width measurement circuit according to claim 7, wherein the time measurement circuit further includes a second multi-stage delay circuit which has N second delay elements connected in a cascade manner, and which applies a predetermined second delay amount to the stop signal at each stage,
 wherein each of the N latch circuits latches the value of either the start signal to be input to the corresponding first delay element or the stop signal to be input to the corresponding second delay element at a timing of an edge in the other signal.

9. A pulse width measurement circuit which generates a signal that corresponds to the pulse width of an input pulse signal, comprising:
 a first inverter which inverts the input pulse signal, and outputs a stop signal;
 a first multi-stage delay circuit having N (where N is an integer) first delay elements connected in a cascade manner, and which applies a predetermined first delay amount t1 to the start signal at each stage;
 a second multi-stage delay circuit having N second delay elements connected in a cascade manner, and which applies a predetermined second delay amount t2 to the stop signal at each stage;
 N latch circuits which are provided to the N pairs of the first delay element and the second delay element correspondingly, and each of which latches the value of either the start signal to be input to the corresponding first delay element or the stop signal to be input to the corresponding second delay element at a timing of an edge in the other signal; and
 a second inverter which generates the start signal by inverting the output signals of the k-th (where k is a natural number) of the N second delay elements, and outputs the start signal to the first multi-stage delay circuit,
 the start signal has the same logical level as the input pulse signal and is delayed relative to the input pulse signal by a delay amount $\tau d = k \times t2 + Ti1 + Ti2$ (where Ti1 is a delay amount of the first inverter and Ti2 is a delay amount of the second inverter), and
 the N latch circuits generate data indicating a pulse width obtained by subtracting the delay amount td from the pulse width of the input pulse signal.

10. A pulse width measurement circuit according to claim 9, further including a selector which receives the output signals of the N second delay elements, selects one of these output signals, and outputs the output signal thus selected,
 wherein the second inverter inverts the output signal of the selector, and outputs the start signal.

11. A pulse width measurement circuit which generates a signal that corresponds to the pulse width of an input pulse signal, comprising:
 a first multi-stage delay circuit having N (N represents an integer) first delay elements connected in a cascade manner, and which applies a predetermined first delay amount t1 to the start signal at each stage;
 a second multi-stage delay circuit having N second delay elements connected in a cascade manner, and which applies a predetermined second delay amount t2 to the stop signal, which is the input pulse signal, at each stage;
 N latch circuits which are provided to the N pairs of the first delay element and the second delay element correspondingly, and each of which latches the value of either the start signal to be input to the corresponding first delay element or the stop signal to be input to the corresponding second delay element at a timing of an edge in the other signal; and
 an inverter which generates the start signal by inverting the output signals of the k-th (where k is a natural number) of the N second delay elements, and outputs the start signal to the first multi-stage delay circuit,
 the start signal has a logical level opposite to that of the input pulse signal and is delayed relative to the input pulse signal by a delayed amount $\tau d = k \times t2 + Ti1$ (where Ti1 is a delay amount of the first inverter), and
 the N latch circuits generate data indicating a pulse width obtained by subtracting the delay amount td from the pulse width of the input pulse signal.

12. A pulse width measurement circuit according to claim 11, further including a selector which receives the output signals of the N second delay elements, selects one of these output signals, and outputs the output signal thus selected,
 wherein the inverter inverts the output signal of the selector, and outputs the start signal.

13. A pulse width measurement circuit comprising:
(a) a first pulse width measurement circuit including,
   (i) a first inverter which inverts the input pulse signal, and outputs a stop signal;
   (ii) a first delay circuit which delays the input pulse signal relative to the stop signal, and outputs a start signal;
   (iii) a first time measurement circuit which receives the start signal and the stop signal, and outputs a signal that corresponds to the time difference between an edge in the start signal and an edge in the stop signal;
(b) a second pulse width measurement circuit including,
   (i) a second inverter which inverts the input pulse signal;
   (ii) a second delay circuit which delays the input pulse signal thus inverted relative to the input pulse signal before the inversion, and outputs a start signal; and
   (iii) a second time measurement circuit which receives the start signal and a stop signal which is the input pulse signal before the inversion, and outputs a signal that corresponds to the time difference between an edge in the start signal and an edge in the stop signal; and
   a selector which receives the signals output from the first pulse width measurement circuit and the second pulse width measurement circuit, and selects one from these signals thus received.

14. A pulse width measurement circuit according to claim 13, wherein the first time measurement circuit of the first pulse width measurement circuit and the second time measurement circuit of the second pulse width measurement circuit share circuitry.

* * * * *